(12) United States Patent
Pereira et al.

(10) Patent No.: US 11,973,481 B2
(45) Date of Patent: Apr. 30, 2024

(54) FREQUENCY SELECTIVE ATTENUATOR FOR OPTIMIZED RADIO FREQUENCY COEXISTENCE

(71) Applicant: Silicon Laboratories Inc., Austin, TX (US)

(72) Inventors: Vitor Pereira, Austin, TX (US); Jeffrey A. Tindle, Austin, TX (US); Mustafa H. Koroglu, Austin, TX (US); Terry Lee Dickey, Pflugerville, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/537,075

(22) Filed: Nov. 29, 2021

(65) Prior Publication Data

US 2022/0085787 A1    Mar. 17, 2022

Related U.S. Application Data

(62) Division of application No. 16/706,433, filed on Dec. 6, 2019, now Pat. No. 11,463,064.

(51) Int. Cl.
| | |
|---|---|
| *H03H 7/01* | (2006.01) |
| *H04B 1/04* | (2006.01) |
| *H04B 1/10* | (2006.01) |
| *H04B 1/18* | (2006.01) |
| *H04B 1/40* | (2015.01) |
| *H04W 4/00* | (2018.01) |

(52) U.S. Cl.
CPC ........ *H03H 7/0115* (2013.01); *H03H 7/0153* (2013.01); *H04B 1/0458* (2013.01); *H04B 1/18* (2013.01); *H04B 1/40* (2013.01); *H03H 2007/013* (2013.01)

(58) Field of Classification Search
None
See application file for complete search history.

(56) References Cited

U.S. PATENT DOCUMENTS

| | | | | |
|---|---|---|---|---|
| 7,477,915 B2* | 1/2009 | Leinonen | ............. | H04B 1/0057 |
| | | | | 455/550.1 |
| 7,676,243 B2* | 3/2010 | Leinonen | ............. | H04B 1/3805 |
| | | | | 455/550.1 |

(Continued)

*Primary Examiner* — Tuan A Tran
(74) *Attorney, Agent, or Firm* — Gary Stanford; Huffman Law Group, PC

(57) ABSTRACT

A wireless transceiver including a receiver circuit coupled to an RF transceiver node, a tunable notch filter coupled between the RF transceiver node and a reference node, and a controller that programs the tunable notch filter with a selected blocker frequency and that selectively enables the tunable notch filter to attenuate at least one blocker signal. The tunable notch filter may include a variable capacitor and an inductor coupled in series between the RF transceiver node and ground. The inductor of the tunable notch filter may include a bondwire coupled between a semiconductor die and a semiconductor package. The inductance may include a physical inductor mounted on the package or a printed circuit board. The tunable notch filter may be enabled by a switch selectively coupling the filter to either the RF transceiver node or ground. The variable capacitor may be digitally programmed with digital values stored in a memory.

20 Claims, 6 Drawing Sheets

(56) References Cited

U.S. PATENT DOCUMENTS

| | | |
|---|---|---|
| 7,706,769 B2 | 4/2010 | Perkins |
| 7,999,608 B1 | 8/2011 | Groe et al. |
| 8,018,288 B2 | 9/2011 | Duster et al. |
| 8,036,623 B2 | 10/2011 | Chang et al. |
| 8,396,427 B2 | 3/2013 | Le Guillou et al. |
| 8,798,554 B2 * | 8/2014 | Darnell ............... H01Q 5/35 |
| | | 455/77 |
| 8,862,081 B2 * | 10/2014 | Sutton ............... H04B 7/0845 |
| | | 455/138 |
| 9,002,309 B2 * | 4/2015 | Sahota ............... H04B 1/1036 |
| | | 455/266 |
| 9,077,440 B2 | 7/2015 | Wyville et al. |
| 9,112,476 B2 | 8/2015 | Basaran et al. |
| 9,112,570 B2 * | 8/2015 | Khlat ............... H04B 1/1036 |
| 9,118,376 B2 * | 8/2015 | Khlat ............... H04B 1/10 |
| 9,124,355 B2 * | 9/2015 | Black ............... H04B 1/525 |
| 9,166,636 B2 | 10/2015 | McCullagh |
| 9,190,699 B2 * | 11/2015 | Granger-Jones ....... H01P 1/10 |
| 9,203,451 B2 | 12/2015 | Kehrer et al. |
| 9,312,897 B2 * | 4/2016 | Steele ............... H04B 1/1036 |
| 9,408,015 B2 * | 8/2016 | Khorram ............... H04W 4/80 |
| 9,413,326 B2 * | 8/2016 | Basaran ............... H03H 7/0153 |
| 9,438,196 B2 * | 9/2016 | Smith ............... H03H 7/1758 |
| 9,525,452 B2 * | 12/2016 | You ............... H04B 1/44 |
| 9,595,935 B2 * | 3/2017 | Kavousian ............... H03F 3/245 |
| 9,698,839 B2 * | 7/2017 | Khlat ............... H03H 9/547 |
| 9,712,196 B2 * | 7/2017 | Ripley ............... H03H 7/1758 |
| 9,929,707 B1 * | 3/2018 | Frei ............... H03F 3/604 |
| 9,954,497 B2 * | 4/2018 | Zhu ............... H03F 3/45179 |
| 9,966,982 B2 * | 5/2018 | Ripley ............... H04B 1/1036 |
| 9,980,277 B2 | 5/2018 | Dickey et al. |
| 9,999,121 B2 * | 6/2018 | Khorrami ............... H01L 23/552 |
| 10,278,200 B2 | 4/2019 | Dickey et al. |
| 10,333,213 B2 | 6/2019 | Zolomy et al. |
| 10,340,963 B2 * | 7/2019 | Ripley ............... H04B 1/0458 |
| 10,342,028 B2 | 7/2019 | Dickey et al. |
| 10,873,486 B1 | 12/2020 | Aboudina et al. |
| 10,979,086 B2 | 4/2021 | Jussila et al. |
| 11,177,988 B2 | 11/2021 | Aboudina et al. |
| 2012/0286892 A1 | 11/2012 | Gu et al. |
| 2018/0242341 A1 | 8/2018 | Dickey et al. |
| 2021/0175870 A1 | 6/2021 | Pereira et al. |
| 2021/0175917 A1 | 6/2021 | Mukherji et al. |

\* cited by examiner

FREQUENCY SELECTIVE ATTENUATOR FOR OPTIMIZED RADIO FREQUENCY COEXISTENCE

CROSS-REFERENCE TO RELATED APPLICATIONS

This application is a divisional application of copending, commonly assigned and currently pending U.S. patent application Ser. No. 16/706,433, filed on Dec. 6, 2019, which is incorporated herein by reference for all intents and purposes.

BACKGROUND OF THE INVENTION

Field of the Invention

The present invention relates in general to wireless communications, and more particularly to a frequency selective attenuator for optimized radio frequency (RF) coexistence that enables a low power victim wireless transceiver to coexist with a high power aggressor wireless transceiver.

Description of the Related Art

Many different wireless RF technologies may be used for several different applications operating in a common area, such as cellular networks, local area networks, home automation systems, Internet of Things (IoT), alarm systems, etc. The use of multiple wireless devices in a common area may cause communication conflicts when using the same radio frequency (RF) or overlapping frequencies. Wireless technologies in the 2.4 Gigahertz (GHz) frequency range include Wi-Fi, Zigbee, Bluetooth (including low energy version or BLE), Thread, etc. Wireless technologies in the sub-GHz frequency range, such as 800-900 Megahertz (MHz), include some lower power Wi-Fi technologies (e.g., MiWi), Z-wave, certain cellular communications (e.g., 3G, 4G, LTE), etc.

The performance of wireless RF transceivers of a lower powered wireless network tends to decrease when in close proximity to higher powered wireless RF transceivers of another network when operating near the same frequency levels. Wireless performance for collocated transceivers, for example, is challenging especially when one of the transmitters operates with very high power while another operates at significantly lower receive signal power levels. Two or more wireless transceivers are referred to as being "collocated" when implemented on the same printed circuit board (PCB) or within the same package or product. This is often the case for alarm systems, gateways, routers or adaptors that include Wi-Fi or LTE operating in frequencies in proximity of lower power systems that are targeting high sensitivity. A low power system is at a disadvantage because the end nodes communicate using low transmit power with low duty cycles, greatly reducing the probability of a successful communication in the presence of a high power level blocker. A signal "blocker" is a coincident signal sufficiently close to the frequency of the signal of interest being received causing various potential impairments to the desired signal, such as distortion, compression, and de-sensitization. One example includes a Zigbee device collocated with a Wi-Fi device at or near 2.4 GHz. Another example is a Z-wave device and cellular device at 800-900 MHz.

SUMMARY OF THE INVENTION

A wireless transceiver according to one embodiment includes a receiver circuit coupled to a radio frequency transceiver node, a tunable notch filter coupled between the radio frequency transceiver node and a reference node, and a controller that programs the tunable notch filter with a selected blocker frequency and that selectively enables the tunable notch filter to attenuate at least one blocker signal. The tunable notch filter may include a variable capacitor and an inductance coupled in series between the radio frequency transceiver node and ground. The inductance may be a bondwire.

The controller may program the tunable notch filter by programming the variable capacitor. The variable capacitor may be integrated on a semiconductor die and coupled to a conductive pad provided on the semiconductor die. The semiconductor die may be mounted to a semiconductor package, in which the bondwire has a first end coupled to the conductive pad and a second end grounded on the semiconductor package. The wireless transceiver may include a switch coupled between the radio frequency transceiver node and the variable capacitor, in which the controller controls the switch to selectively enable the tunable notch filter. The enable/disable switch may alternatively be coupled between the variable capacitor and a ground connection. The wireless transceiver may include a memory, in which the controller programs the tunable notch filter by programming the variable capacitor with a programmed value stored in the memory.

The inductance may be configured as a physical inductor coupled in series with the bondwire. The variable capacitor may be integrated on a semiconductor die having a conductive pad coupled to one end of the variable capacitor, in which the bondwire has a first end coupled to the conductive pad and has a second end coupled to a first end of the physical inductor. The semiconductor die may be mounted to a semiconductor package, in which the physical inductor may be mounted on the semiconductor package having a second end coupled to a ground connection of the semiconductor package. Alternatively, the second end of the physical inductor may be coupled to a conductive path which is electrically coupled to the radio frequency transceiver node provided on the semiconductor die.

The wireless transceiver may include a printed circuit board and the semiconductor die may be mounted to a semiconductor package. The physical inductor may be mounted on the printed circuit board having a second end coupled to a ground connection of the printed circuit board. Alternatively, the second end of the physical inductor mounted on the printed circuit board may be coupled to a conductive path which is electrically coupled to the radio frequency transceiver node provided on the semiconductor die.

A wireless communication system according to one embodiment may include a communication package incorporating an aggressor wireless transceiver, a victim wireless transceiver, and a host system interfaced with the aggressor wireless transceiver and the victim wireless transceiver. The victim wireless transceiver may include a receiver circuit coupled to a radio frequency transceiver node, a tunable notch filter coupled between the radio frequency transceiver node and a reference node, and a controller that programs the tunable notch filter with a selected blocker frequency and that selectively enables the tunable notch filter to attenuate at least one blocker signal including at least one transmission frequency of the aggressor wireless transceiver. The tunable notch filter may include a variable capacitor and an inductance coupled in series between the radio frequency transceiver node and ground. In one embodiment, the inductance is a bondwire. In another embodiment, the inductance may be a bondwire coupled in series with a physical inductor.

The host system or the wireless aggressor transceiver may provide an indication to the controller of pending transmission of the aggressor wireless transceiver along with an indication of the frequency of transmission. The tunable notch filter may be digitally programmable, in which a memory may be included and programmed with multiple digital values corresponding to the transmission frequencies of the aggressor wireless transceiver.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the need to resolve conflicts between collocated or nearby wireless RF transceivers of a wireless communication system. They have therefore developed a victim wireless receiver with a frequency selective attenuator for optimized RF coexistence that enables a low power victim wireless transceiver to coexist with a high power aggressor wireless transceiver.

Figure 1:
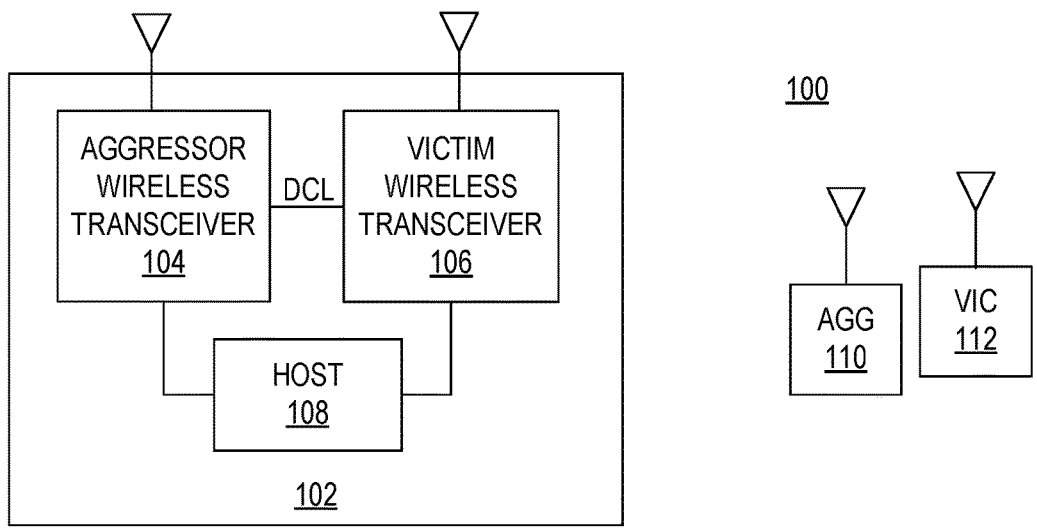
FIG. 1 is a simplified illustration of a local network including a communication system with collocated wireless transceivers, including one or more aggressor wireless transceivers and one or more victim wireless transceivers implemented according to one embodiment of the present disclosure.

FIG. 1 is a simplified illustration of a local network 100 including a wireless communication system 102 with collocated wireless transceivers, including an aggressor wireless transceiver 104 and a victim wireless transceiver 106 implemented according to one embodiment of the present disclosure. The local network 100 also shows another aggressor wireless transceiver 110 and another victim wireless transceiver 112 that are in close proximity to each other. In this context, an aggressor wireless transceiver, including the aggressor wireless transceivers 104 and 110, typically operates at relatively high power and/or a high duty cycle, and a victim wireless transceivers, including the victim wireless transceivers 106 and 112, typically operates to receive low power and/or a low duty cycle signals. Although the wireless transceivers 110 and 112 are not collocated, similar wireless communication issues may arise when in close proximity with each other.

The wireless transceivers 104 and 106 are referred to as being collocated when implemented on the same printed circuit board (PCB) or within the same package or product and are thus in very close proximity to each other. The wireless communication system 102 may be configured as any type of wireless device such as, for example, a gateway, a router, an adapter, an alarm system, etc., in which different wireless technologies or protocols are provided within the same device or product. The wireless communication system 102 may be a gateway in which the aggressor wireless transceiver 104 is a Wi-Fi device and the victim wireless transceiver 106 may be a Zigbee device. Alternatively, the wireless communication system 102 may be an alarm system in which the aggressor wireless transceiver 104 is a cellular device (e.g., LTE) and the victim wireless transceiver 106 is a Z-wave device. Many other collocated configurations are contemplated. The wireless communication system 102 may include a host circuit 108 coupled to both of the transceivers 104 and 106. The transceivers 104 and 106 may also share a direct communication link (DCL), such as a serial peripheral interface (SPI), an inter-integrated circuit (I2C) interface, or any other suitable communication interface including a custom control interface. A gateway, for example, may incorporate Internet access, such as an integrated modem or Ethernet connection from one or more gateways to a main router, or a Wi-Fi connection to the main router. The victim wireless transceiver 106 may serve as a Zigbee coordinator or the like of a home automation system supported by the wireless network 100.

Wi-Fi transceivers may be implemented according to any one of the various IEEE 802.11 standards, such as 802.11a, 802.11b, 802.11g, 802.11n, etc. IEEE 802.11n, for example, may operate using 20 Megahertz (MHz) bandwidth channels and orthogonal frequency-division multiplexing (OFDM) subcarrier modulation. The wireless transceiver 106 may operate according to the IEEE 802.15.4 standard. Wi-Fi (IEEE 802.11b/g/n) supports up to 14 overlapping 20/22 MHz bandwidth channels across the 2.4 Gigahertz (GHz) ISM band with transmit power levels up to +30 dBm (decibel-milliwatts). 2.4 GHz Zigbee and other protocols (e.g., Thread), which are based on IEEE 802.15.4, support 16 non-overlapping 2 MHz bandwidth channels at 5 MHz spacing with transmit powers up to +20 dBm. Different devices using these wireless protocols may successfully operate in the local network 100, although some communication conflicts may occur.

When collocated, the aggressor wireless transceiver 104 may impede the ability of the victim wireless transceiver 106 to receive communications from other victim wireless transceivers or devices in the local network 100. Similarly, when in close proximity, the aggressor wireless transceiver 110 may impede the ability of the victim wireless transceiver 112 to receive communications from other victim wireless transceivers or devices in the local network 100. In particular, when an aggressor wireless transceiver is transmitting at relative high power and high duty cycle, it tends to function as a blocker to collocated or closely located victim wireless transceivers operating at significantly less power levels.

The victim wireless transceivers 106 and 112 are configured with a frequency selective attenuator as further described herein to optimize reception to allow RF coexistence with the aggressor wireless transceivers 104 and 110.

Figure 2:
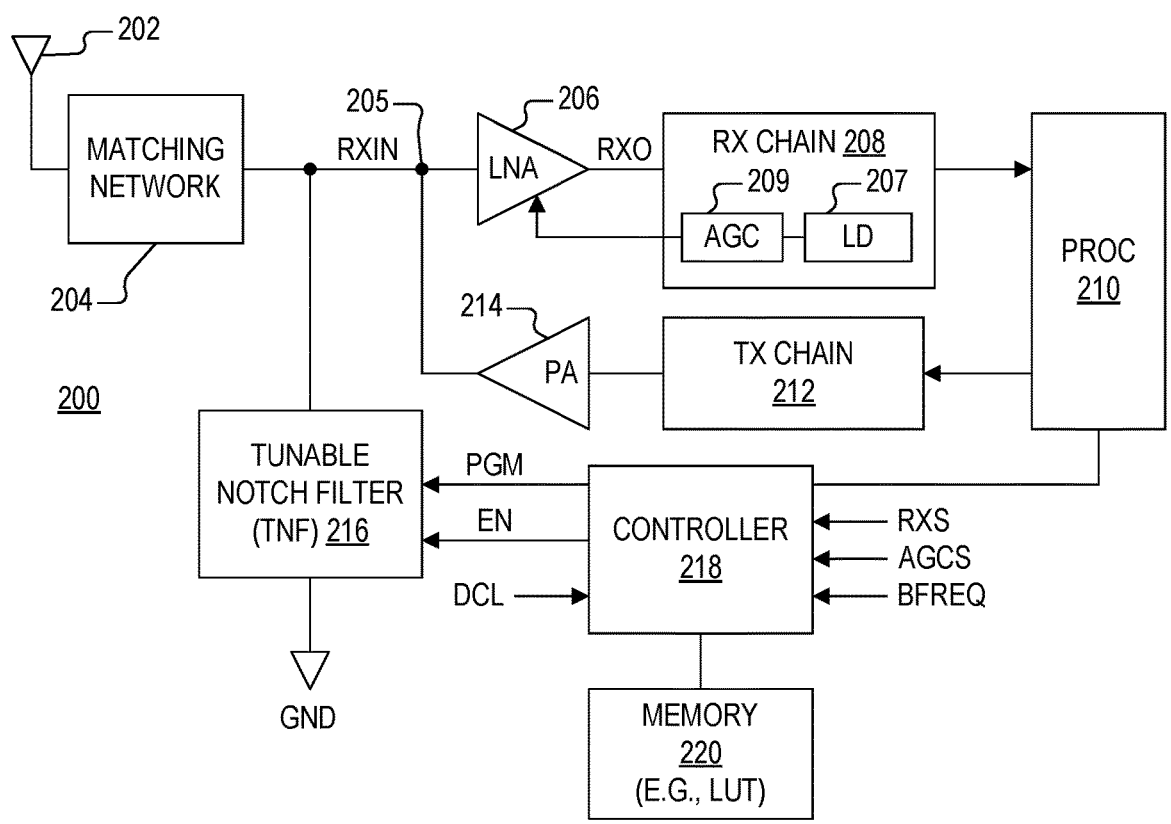
FIG. 2 is a simplified block diagram of a victim wireless transceiver including a tunable notch filter (TNF) implemented according to one embodiment of the present disclosure which may be used as either or both of the victim transceivers of FIG. 1.

FIG. 2 is a simplified block diagram of a victim wireless transceiver 200 including a tunable notch filter (TNF) 216 implemented according to one embodiment of the present disclosure which may be used as either or both of the victim transceivers 106 or 112. An antenna 202 for transmitting or receiving wireless RF signals is coupled through a matching network 204 to a transceiver node 205 carrying an RX input signal RXIN. Received signals are provided to an input of a low-noise amplifier (LNA) 206, having an output providing amplified (and filtered) received signals RXO to a receive (RX) chain circuit 208 for down-converting the frequency of the received signal and converting the received signal to digital format for further processing by a processor 210. The processor 210 outputs digital signals for transmission to a transmit (TX) chain circuit 212, which converts to analog format and upconverts to an RF frequency for transmission. The TX chain circuit 212 has an output coupled to the input of a power amplifier (PA) 214, which amplifies the signal for transmission by the antenna 202 via the matching network 204.

The RX chain circuit 208 may include a level detector (LD) 207 and an automatic gain control (AGC) circuit 209. The level detector 207 may actually represent one or more level detectors, in which each detector may be implemented as a peak detector, an amplitude detector, a signal level detector for determining the root-mean-square (RMS) level of an input voltage level, an envelope detector, etc., depending upon its function and where in the RX chain circuit 208 an incoming signal is being monitored. When a signal is being received, the AGC circuit 209 may adjust the gain of the LNA 206 and may also adjust other gain blocks in the RX chain circuit 208 to adjust the amplitude of the incoming signal to within a target range of an analog to digital converter (ADC) (not shown) within the RX chain circuit 208. The LD 207 may include multiple level detectors that monitor the receive signal at different points in the receive signal chain. At least one level detector may monitor the RF level of the signal before down conversion at the transceiver node 205 or after the LNA 206. In most cases, RF level detectors are wide band and are sensitive to blocker signals. The LD 207 may also include at least one narrow band level detector located after down conversion and reactive mostly to in-band signals.

In one embodiment the victim wireless transceiver 200 operates at low power (and usually low duty cycle) in which the LNA 206 and the RX chain circuit 208 are configured to detect low power signals transmitted in the wireless medium and received via the antenna 202. A collocated or nearby aggressor wireless transceiver, such as either of the aggressor wireless transceivers 104 or 112, may block reception of low power signals if simultaneously transmitting at a nearby frequency. The transmission by the aggressor wireless transceiver is at a relatively higher power causing the AGC circuit 209 to reduce the gain of the LNA 206 to a level that might otherwise prevent successful reception of desired low power signals if the aggressor transmit signal was not attenuated.

The victim wireless transceiver 200 further includes the TNF 216 coupled between the transceiver node 205 and a reference node, such as ground (GND). The TNF 216 is tuned to the transmission frequency of the collocated or nearby aggressor wireless transceiver in order to attenuate the aggressor transmit power and protect the victim front end of the victim wireless transceiver 200 including the LNA 206 and the RX chain circuit 208 from compression. When the TNF 216 is tuned correctly, the aggressor transmit power is sufficiently attenuated so that the LNA 206 may be kept at sufficient gain to detect and successfully receive desired low power signals.

In one embodiment, the TNF 216 may be tuned to a particular blocker frequency, such as during a calibration procedure or the like, and may also remain enabled during operation of the victim wireless transceiver 200. It is noted, however, that multiple different blocker signals at different frequencies may be encountered so that the TNF 216 may be re-tuned during operation. In addition, since the blocker frequency is sufficiently close to the frequency of operation of the victim wireless transceiver 200, the TNF 216 may attenuate the energy of wanted channels which may harm performance. The receive sensitivity may be degraded when TNF 216 is enabled, so that it may be turned off or disabled when not needed.

The victim wireless transceiver 200 includes a controller 218 coupled to the processor 210 which programs the TNF 216 via one or more program (PGM) signals to a selected blocker frequency and that further enables/disables the TNF 216 via an enable (EN) signal. Although shown as a separate circuit, the controller 218 may be incorporated into the processor 210. For example, the firmware of the processor 210 may be programmed with the programming and enable functions of the controller 218. The victim wireless transceiver 200 may further include a memory 220 coupled to the controller 218 for storing programmed values for programming the TNF 216. In one embodiment, the memory 220 may be configured as a lookup table (LUT) or the like for storing a programmed value for each of one or more blocker frequencies of interest. In one embodiment, the memory 220 may be any type of non-volatile memory (NVM), such as any type of read-only memory (ROM) device, including programmable types of NVM, such as an electrically erasable programmable ROM (EEPROM) or the like.

The controller 218 is responsive to various signals indicative of conditions for enabling or disabling TNF 216 and for programming its frequency of attenuation. A signal RXS indicates the receive state of the victim wireless transceiver 200, meaning whether the victim wireless transceiver 200 is in active transmit or receive mode of operation. A signal AGCS indicates the state of the AGC 209, meaning the relative strength of detected signals including blocker signals. The RXS and AGCS signals may be provided by the processor 210 and are used by the controller 218 for determining whether and when to enable the TNF 216. A signal BFREQ provided to the controller 218 indicates frequency of a blocker signal for programming the frequency of the TNF 216 if and when known. The controller 218 may also be coupled directly to a collocated aggressor wireless transceiver, such as, for example, the aggressor wireless transceiver 104, via the DCL for direct inter-transceiver communications.

In one embodiment, it may be predetermined that one or more transmission channels of a collocated aggressor wireless transceiver, such as the aggressor wireless transceiver 104, operate as strong blocker signals negatively impacting the ability of the victim wireless transceiver 106 to detect and receive desired signals. The host circuit 108 of the wireless communication system 102 detects or is otherwise is programmed with the active transmission channels and transmission timing of the aggressor wireless transceiver 104, so that when a transmission is imminent, it may prompt the controller 218 and adjust the BFREQ signal indicative of the blocker frequency of aggressor transmission. Alternatively, or in addition, the collocated aggressor wireless transceiver may directly communicate via the DCL that transmission is imminent in which the TNF 216 may be engaged automatically with known settings. The DCL communication may simply be an indication of the power amplifier (PA) enable signal of the aggressor wireless transceiver. The DCL provides a faster communication link enabling a faster response by the victim wireless transceiver 200. If the victim wireless transceiver 200 is not already actively receiving a signal, it may program and activate the TNF 216 accordingly.

Figure 3:
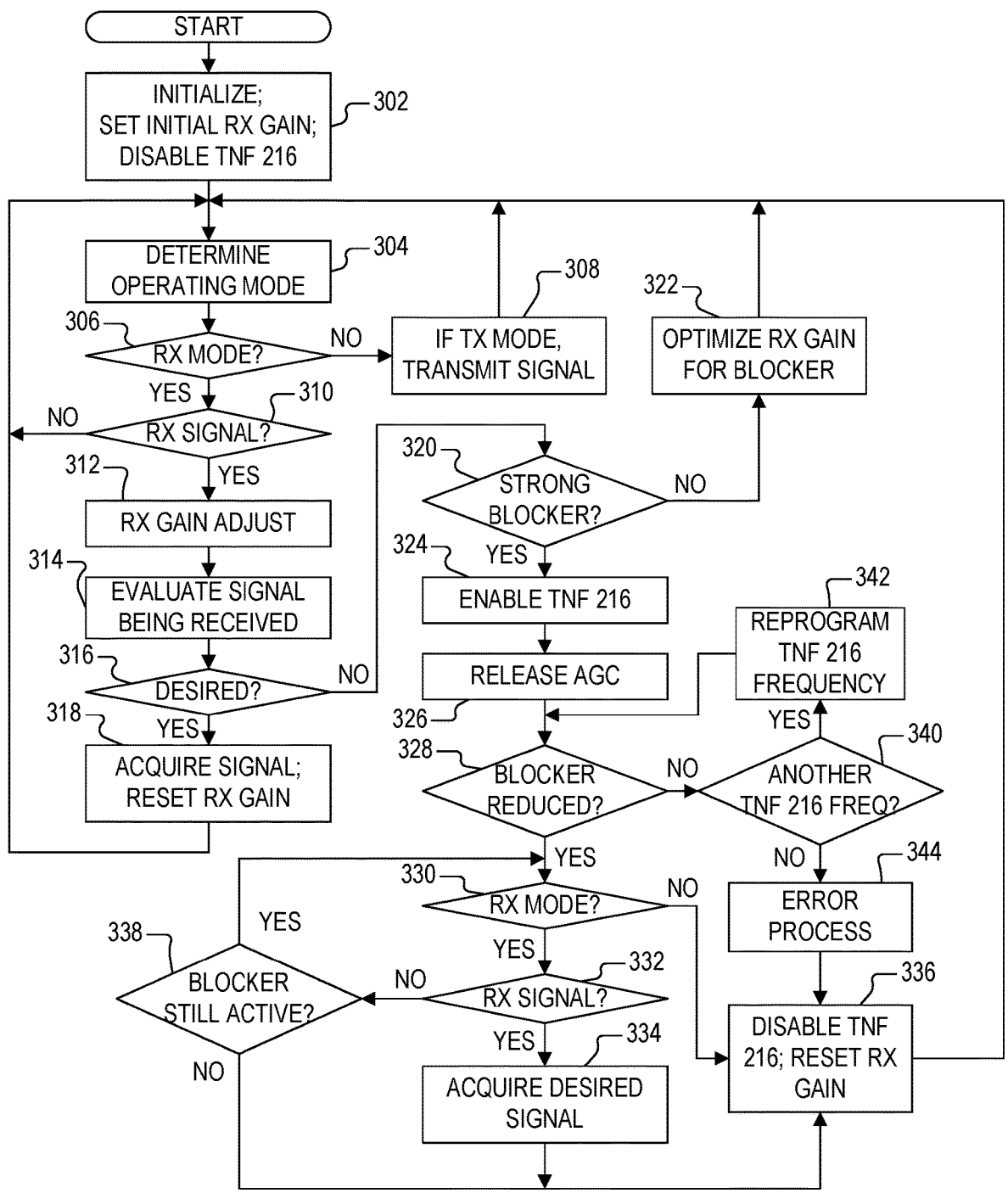
FIG. 3 is a flowchart diagram illustrating operation of the victim wireless transceiver of FIG. 2 including operation of the controller for tuning and enabling or disabling the TNF of the wireless transceiver according to one embodiment of the present disclosure.

FIG. 3 is a flowchart diagram illustrating operation of the victim wireless transceiver 200 including operation of the controller 218 for tuning and enabling or disabling the TNF 216 according to one embodiment of the present disclosure. After power on or reset (POR) or after waking from a sleep mode, the victim wireless transceiver 200 is initialized, the initial RX gain is set, and the TNF 216 is initially disabled. The initial RX gain typically means that the gain of the LNA 206 and other gain blocks within the RX chain 208 are set to maximum gain for detecting weak signals transmitted in the communication medium. At next block 304, the operating mode is determined, such as either a transmit (TX) mode or a receive (RX) mode. Other operating modes may be defined but are not described. At next block 306, it is queried whether the victim wireless transceiver 200 is in the RX mode of operation. If not, then operation advances to block 308 in which the processor 210 outputs a signal for transmission if in the TX mode, and the signal is transmitted. Operation then loops back to block 304 after successful transmission.

If instead it is determined at block 306 that the victim wireless transceiver 200 is in the RX mode of operation, then operation proceeds to block 310 to determine whether a signal is being received. If not, operation loops back to block 304, and operation loops between blocks 304, 306 and 310 during the RX mode until a signal is detected. When an RX signal is detected, operation advances instead to block 312 in which normal receive mode operations are performed including adjusting the RX gain of the LNA 206 and/or the RX chain circuit 208 in an attempt to adjust the amplitude of the incoming signal to within a target range of the ADC of the RX chain circuit 208 as previously described. The RX gain is reduced commensurate with the strength of the signal being received. At next block 314, while the signal is being received, the processor 210 evaluates the signal being received by the victim wireless transceiver 200. At next block 316, it is queried whether the signal is a "desired" signal meaning that it is intended for the victim wireless transceiver 200. If so, operation advances to block 318, in which the signal is acquired according to normal receive operations, and once acquired, the RX gain is reset back to initial conditions for receiving any other signals. Operation then loops back to block 304 for further operations.

Referring back to block 316, if the signal is not a desired signal, meaning that it is not intended for the victim wireless transceiver 200 and may otherwise be a blocker signal, then operation advances instead to block 320 to evaluate the relative strength of the blocker signal. If the blocker signal is relatively weak or otherwise is not sufficiently strong to prevent the victim wireless transceiver 200 from receiving weak desired signals, then operation advances to block 322 in which the RX gain may be optimized for receiving desired signals in the presence of the blocker signal (which is not sufficiently strong to block desired signals). At this point, the TNF 216 remains disabled and operation loops back to block 304 for mode determination. It is noted that the RX gain may have been adjusted for the presence of the weak or mid-strength blocker signal. The victim wireless transceiver 200 may have provision, such as at block 304, for monitoring the presence of the blocker signal so that the RX gain may be re-adjusted if and when the weaker blocker signal terminates. If so, the RX gain may be re-initialized back to maximum levels for detecting weak desired signals.

Referring back to block 320, if the blocker signal is strong, meaning that the RX gain including the gain of the LNA 206 is set too low for detecting weak desired signals, then operation advances instead to block 324 in which the TNF 216 is enabled in an attempt to attenuate the strong blocker signal. The TNF 216 may be initially programmed at a default frequency, or at the frequency of a known blocker signal. As an example, the host circuit 108 may inform the controller 218 of the channel of operation of the aggressor wireless transceiver 104, in which the controller 218 programs the TNF 216 accordingly. Assuming that the aggressor wireless transceiver 104 is transmitting causing the strong blocker signal, then activation of the TNF 216 likely attenuates the strength of the blocker signal to enable successful receive operations by the victim wireless transceiver 200.

Operation then advances to block 326 in which the AGC is released to adjust or otherwise re-adjust the RX gain after the TNF 216 is enabled. Operation then advances to block 328 in which the controller 218 evaluates the AGCS signal to determine the adjusted state of the AGC 209. If the AGCS signal indicates that the strength of the blocker signal is reduced, then operation advances to block 330 to query whether the victim wireless transceiver 200 is still in the RX mode of operation. If so, then operation advances to block 332 to query whether a desired signal is detected. If so, then operation advances to block 334 in which the desired signal is acquired, and then operation advances to block 336 in which the TNF 216 is disabled and the RX gain is reset back to initial conditions. Operation then loops back to block 304. It is noted that if the blocker signal terminates while a desired signal is being received at block 334, then the TNF 216 remains enabled in spite of the fact that the blocker signal has terminated to avoid undesired transients during reception of a desired signal.

Referring back to block 332, if a desired signal is not detected, operation instead proceeds to block 338 to query whether the strong blocker signal is still active. If so, then operation loops back to block 330, and operation loops between blocks 330, 332 and 338 while in the RX mode in the presence of the strong blocker signal attenuated by the TNF 216. It is noted that other non-desired signals may be detected while the strong blocker signal is active, but such signals are rejected or otherwise ignored according to normal receive operation. If the strong blocker signal terminates as determined at block 338, then operation instead proceeds to block 336 in which the TNF 216 is disabled and the RX gain reset before returning back to block 304.

Referring back to block 328, if the strength of the blocker signal is not reduced, then the TNF 216 may not be programmed to the correct frequency so that it is queried at block 340 whether the TNF 216 should be programmed to another frequency. If multiple frequencies are to be tried, then operation advances to block 342 in which the controller 218 selects another frequency and re-programs the TNF 216. If the blocker frequency is known then the TNF 216 is tuned to the known blocker frequency. If the blocker frequency is not known, then the TNF 216 may be tuned to the most probable blocker locations depending upon which types of aggressor devices are collocated or in close proximity, such as non-co-channel most used Wi-Fi channels or LTE up-link frequencies and the like.

Operation then loops back to block 328 to determine whether the blocker strength is reduced. Operation may loop between blocks 328, 340 and 342 until the TNF 216 is programmed to the correct frequency to attenuate the strength of the blocker signal. If so, then operation can proceed to block 330 to receive desired signals. If the blocker signal terminates during this process, then although not specifically shown, operation advances to block 336 to disable the TNF 336 and reset the RX gain before returning to block 304. If instead the blocker signal remains active and the TNF 216 has been programmed with all known or otherwise available frequencies, then operation instead advances to block 344 in which an error process may be performed. It is noted that the TNF 216 is specifically designed within the operating frequency range of the victim wireless transceiver 200 so that a programmed frequency of the TNF 216 should be available to attenuate the strong blocker signal under normal conditions. After block 344, operation advances to block 336 previously described before returning back to block 304.

As previously described, the LD 207 may include a wideband RF level detector sensitive to the blocker and blocker attenuation and a narrow band level detector more sensitive to attenuation of the in-band wanted signal. Although not specifically described in FIG. 3, even if the TNF 216 is successfully attenuates a blocker signal, the TNF 216 may nonetheless be disabled if the TNF 216 also attenuates the wanted signal by more than a desired amount. In other words, attenuation of the wanted signal should not exceed a predetermined level for the TNF 216 to be enabled.

Figure 4:
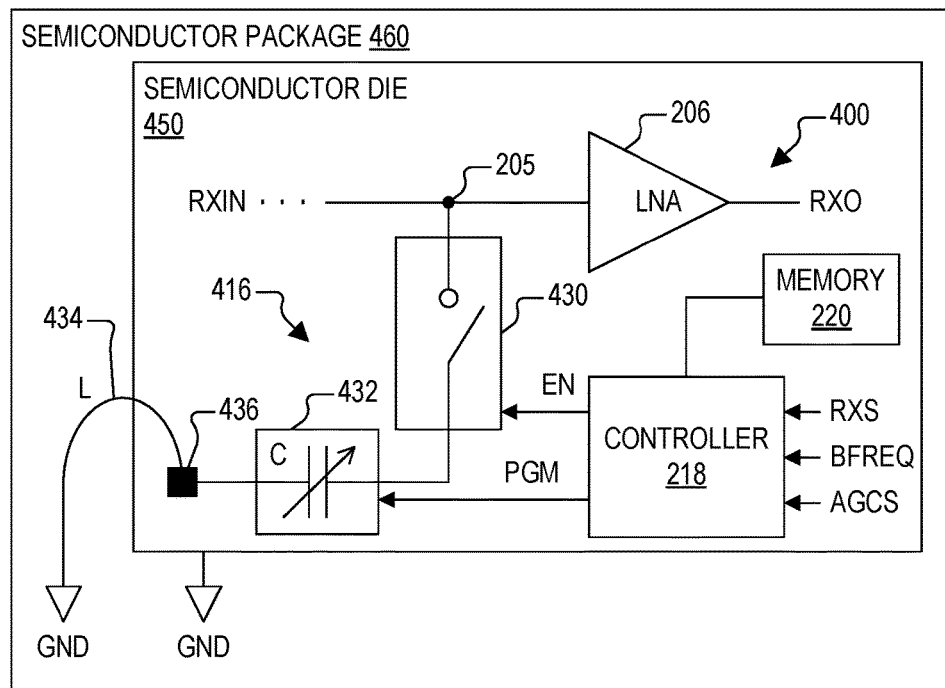
FIG. 4 is a simplified schematic and block diagram of a portion of a victim wireless transceiver implemented according to an embodiment of the present disclosure in which the TNF is configured as a tunable notch filter using only a bondwire as the inductance.

FIG. 4 is a simplified schematic and block diagram of a portion of a victim wireless transceiver 400 implemented according to an embodiment of the present disclosure in which the TNF 216 is configured as a tunable notch filter 416 using only a bondwire as an inductor 434. The victim wireless transceiver 400 is configured in a similar manner as the victim wireless transceiver 200 in which similar components assume identical reference numerals. The victim wireless transceiver 400 is shown provided on a semiconductor chip or semiconductor die 450 which is further mounted on a semiconductor package 460 (e.g., standard package). The victim wireless transceiver 400 includes the transceiver node 205, the LNA 206, the tunable notch filter 416, the memory 220, and the controller 218 which are shown provided on the semiconductor die 450. It is understood that remaining portions of the victim wireless transceiver 400, such as the RX and TX chain circuits 208 and 212, the processor 210, and the PA 214 are included but not shown. Although not shown, external components, such as the matching network 204 and the antenna 202 may also be included and coupled in a similar manner as the victim wireless transceiver 200. The semiconductor package 460 and one or more of the external components may be mounted on a printed circuit board (PCB) or the like (not shown).

The tunable notch filter 416 includes a switch 430, a variable capacitor 432 with capacitance C, and the inductor 434 with inductance L. The switch 430 has one terminal coupled to the transceiver node 205 and another terminal coupled to one terminal of the variable capacitor 432, which has its other terminal coupled to one terminal of the inductor 434 at a conductive pad 436 of the semiconductor die 450. The other terminal of the inductor 434 is coupled to a GND connection of the semiconductor package 460. The switch 430 is illustrated as a single-pole, single-throw (SPST) switch having a control terminal controlled by an enable (EN) signal from the controller 218. The switch 430 may be implemented as a transistor device, such as, for example, a CMOS device such as an N-type or P-type bipolar junction transistor (BJT) or a PMOS or NMOS transistor or the like. In one embodiment, EN is asserted (e.g., pulled high) to close the switch 430 to enable or activate the tunable notch filter 416 by coupling it to the transceiver node 205. The tunable notch filter 416 is disconnected or disabled when EN is de-asserted (e.g., pulled low) opening the switch 430.

Figure 8:
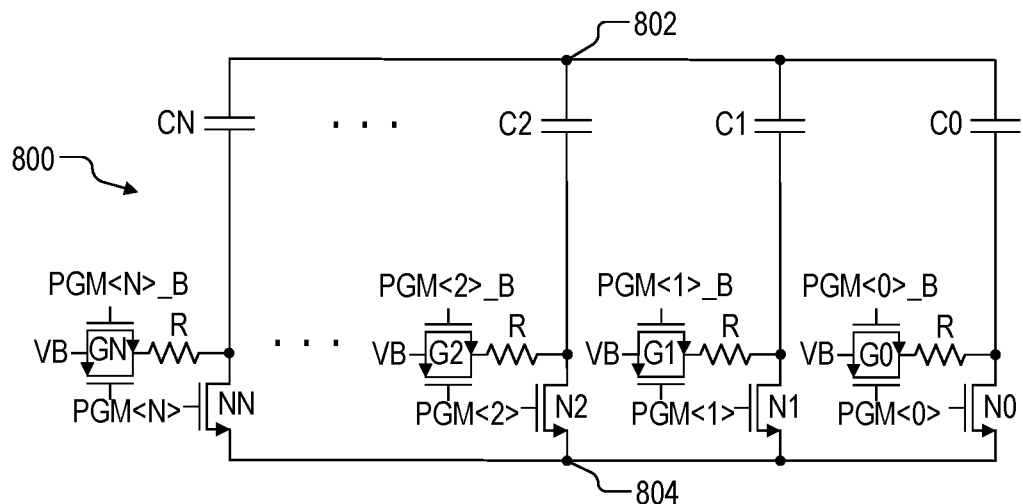
FIG. 8 is a simplified schematic diagram of a digitally programmable capacitor that may be used as the variable capacitor for any of the tunable notch filters according to one embodiment of the present disclosure.

The variable capacitor 432 may be implemented as a programmable capacitor that is programmed by a digital program (PGM) value provided by the controller 418. As an example, the variable capacitor 432 may be implemented by multiple capacitors coupled in parallel activated by corresponding switches each controlled by corresponding bit of the digital PGM value such as shown in FIG. 8. The programmed capacitance is a value C.

The inductor 434 is shown configured as a conductive bondwire connected between the conductive pad 436 of the semiconductor die 450 and the conductive GND connection of the underlying semiconductor package 460, in which the bondwire has an inductance L. A bondwire configuration is appropriate if the bondwire has a suitable value of inductance L that when combined with the capacitance C is programmable within a blocker frequency range of blockers that may negatively impact the frequency range of operation of the victim wireless transceiver 200. In addition, the variable capacitor 432 is configured to have a sufficient quality factor Q to appropriately attenuate the blocker frequency without significantly impacting the operating frequency range of the victim wireless transceiver 400.

For example, a bondwire implementing the inductor 434 having an inductance L=1 nano-Henry (nH) and a programmable capacitor implementing the variable capacitor 332 programmed with a capacitance of C=4.35 pico-Farads (pF) with a Q value of approximately 30 resonating at 2.412 GHz is suitable for attenuating a Wi-Fi signal at the center of Wi-Fi channel 1 6 decibels (dB) more than the center of 15.4 channel 25 at 2.475 GHz. Another example is a European configuration of Z-wave in the 868 MHz frequency band in close proximity of the LTE uplink band 5 (824-849 MHz) and 7 (880-915 MHz).

Figure 5:
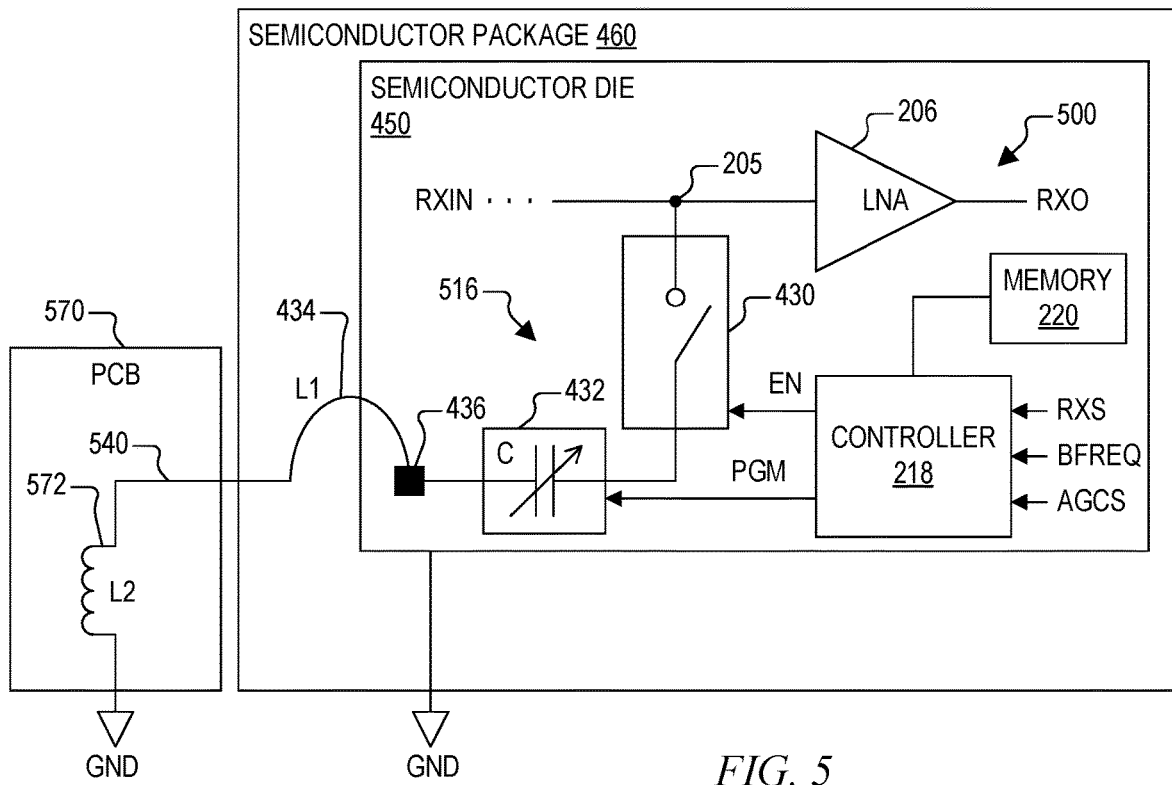
FIG. 5 is a simplified schematic and block diagram of a portion of another victim wireless transceiver implemented according to an embodiment of the present disclosure in which the TNF is configured as a tunable notch filter using a bondwire and a separate inductor as the inductance.

FIG. 5 is a simplified schematic and block diagram of a portion of another victim wireless transceiver 500 implemented according to an embodiment of the present disclosure in which the TNF 216 is configured as a tunable notch filter 516 using a bondwire and a physical inductor 572 as the inductance. The victim wireless transceiver 500 is configured in a similar manner as the victim wireless transceiver 400 in which similar components assume identical reference numerals. The victim wireless transceiver 500 is also shown provided on the semiconductor die 450 upon which the transceiver node 205, the LNA 206, a portion of the tunable notch filter 416, the memory 220, and the controller 218 are implemented. It is understood that remaining portions of the victim wireless transceiver 400, such as the RX and TX chain circuits 208 and 212, the processor 210, and the PA 214 are included but not shown. Although not shown, external components, such as the matching network 204 and the antenna 202 may also be included and coupled in a similar manner as shown in FIG. 2. The semiconductor die 450 is mounted on the semiconductor package 460 in a similar manner previously described.

The tunable notch filter 516 is configured in substantially similar manner as the tunable notch filter 416 including the switch 430, the variable capacitor 432, and the inductor 434 coupled in substantially similar manner. The controller 218 programs the variable capacitor 432 via PGM in similar manner and enables or disables the tunable notch filter 516 in similar manner via EN. Also, the inductor 434 is included and provided has a bondwire having an inductance L1 and having one terminal coupled to the conductive pad 436. The other terminal of the inductor 434, however, is not coupled directly to GND but instead is coupled to one terminal of the inductor 572 via an external conductor 540, in which the inductor 572 is mounted on an external PCB 570. The semiconductor package 460 may also be mounted on the PCB 570. The inductor 572 may be implemented as a physical inductor with inductance L2 and has its other terminal coupled to a separate GND connection. In this case, the inductor 572 is mounted on the PCB 570 external to the semiconductor package 460 and the inductance of the notch filter inductor is L1+L2.

Figure 6:
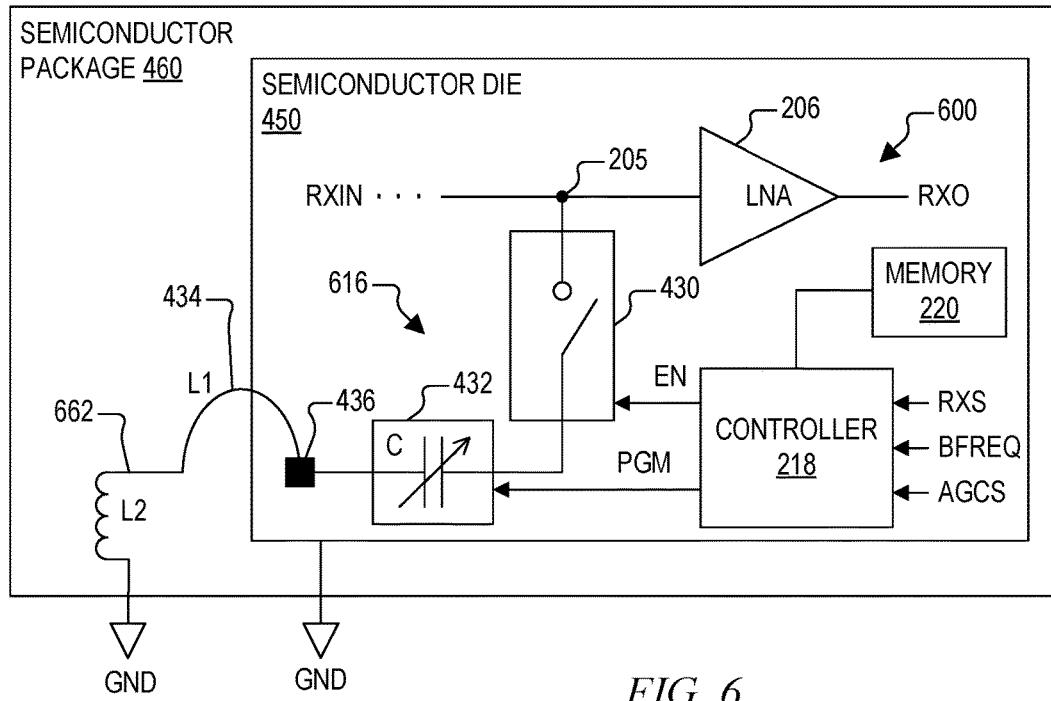
FIG. 6 is a simplified schematic and block diagram of a portion of another victim wireless transceiver implemented according to an embodiment of the present disclosure in which the TNF is configured as a tunable notch filter using a bondwire and an in-package inductor as the inductance.

FIG. 6 is a simplified schematic and block diagram of a portion of another victim wireless transceiver 600 implemented according to an embodiment of the present disclosure in which the TNF 216 is configured as a tunable notch filter 616 using a bondwire and an in-package physical inductor 662 as the inductance. The victim wireless transceiver 600 is configured in a similar manner as the victim wireless transceiver 500 in which similar components assume identical reference numerals. The victim wireless transceiver 600 is also shown provided on the semiconductor die 450 upon which the transceiver node 205, the LNA 206, a portion of the tunable notch filter 416, the memory 220, and the controller 218 are implemented. It is understood that remaining portions of the victim wireless transceiver 400, such as the RX and TX chain circuits 208 and 212, the processor 210, and the PA 214 are included but not shown. Although not shown, external components, such as the matching network 204 and the antenna 202 may also be included and coupled in a similar manner as the victim wireless transceiver 200. The semiconductor die 450 is mounted on the semiconductor package 460 in a similar manner previously described.

The tunable notch filter 616 is configured in substantially similar manner as the tunable notch filter 516 including the switch 430, the variable capacitor 432, and the inductor 434 coupled in substantially similar manner. The controller 218 programs the variable capacitor 432 via PGM in similar manner and enables or disables the tunable notch filter 616 in similar manner via EN. The inductor 434 is included and provided has a bondwire having an inductance L1 and having one terminal coupled to the conductive pad 436. The other terminal of the inductor 434 is coupled to one terminal of the inductor 662 mounted as a physical inductor on the semiconductor package 460 rather than on an external PCB. The inductor 662 is also a physical inductor with inductance L2 and has its other terminal coupled to a separate GND connection of the semiconductor package 460. Again, the inductance of the notch filter inductor is L1+L2.

Figure 7:
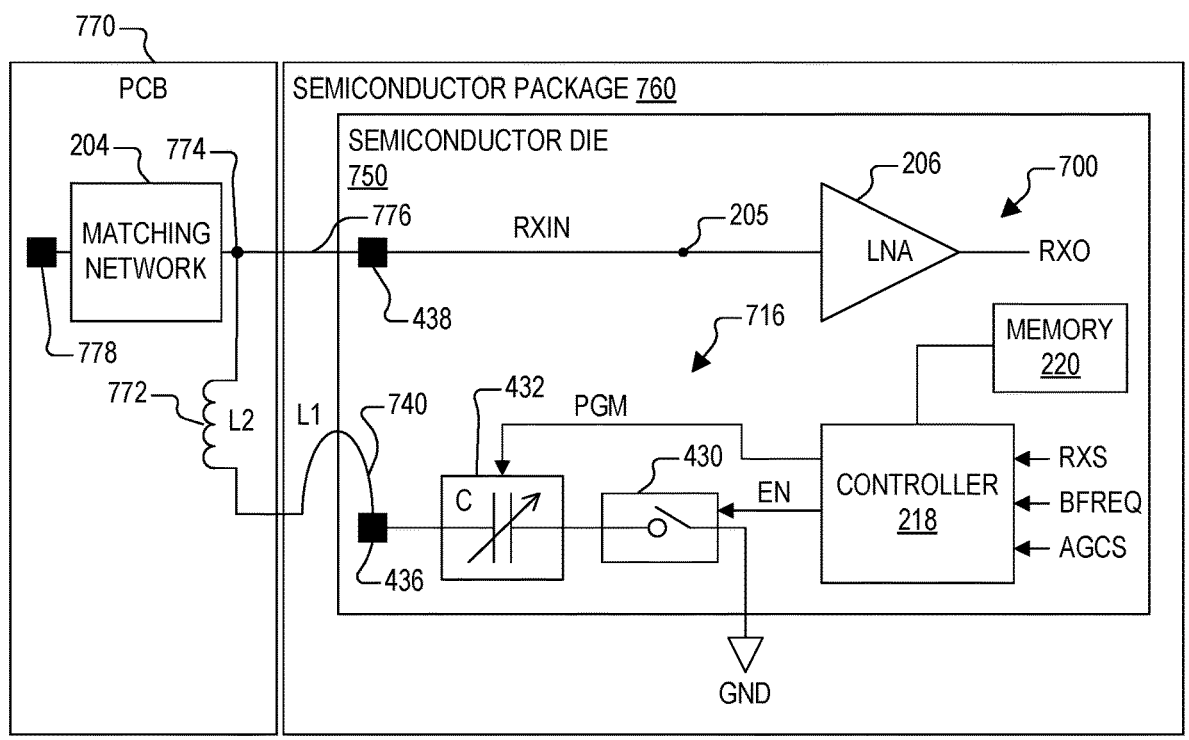
FIG. 7 is a simplified schematic and block diagram of a portion of another victim wireless transceiver implemented according to another embodiment of the present disclosure in which elements of the TNF are arranged in a different order.

FIG. 7 is a simplified schematic and block diagram of a portion of another victim wireless transceiver 700 implemented according to another embodiment of the present disclosure in which elements of the TNF 216 are arranged in a different order. The victim wireless transceiver 700 is configured in a similar manner as the victim wireless transceiver 500 in which similar components assume identical reference numerals. The victim wireless transceiver 700 is also shown provided on a semiconductor die 750 upon which the transceiver node 205, the LNA 206, a portion of the tunable notch filter 716, the memory 220, and the controller 218 are implemented. It is understood that remaining portions of the victim wireless transceiver 700, such as the RX and TX chain circuits 208 and 212, the processor 210, and the PA 214 are included but not shown. The semiconductor die 750 is mounted on the semiconductor package 760 in a similar manner as the semiconductor die 450 and the semiconductor package 460.

The tunable notch filter 716 includes similar components and operates in a similar manner. The tunable notch filter 716 also includes the switch 430, the variable capacitor 432, and the conductive pad 436 coupled a different manner. In this case, one terminal of the switch 430 is coupled to GND and its other terminal is coupled to one terminal of the variable capacitor 432, having its other terminal coupled to the conductive pad 436. The conductive pad 436 is coupled to one terminal of a physical inductor 772 mounted on a separate PCB 770 via a bondwire 740 having an inductance L1. The inductor 772 may also be a physical inductor with inductance L2. The other terminal of the inductor 772 is coupled to a node 774 on the PCB 770, which is coupled to the transceiver node 205 via an off-chip conductor 776 and a conductive pad 438 of the semiconductor die 750. The matching network 204 is shown mounted on the PCB 770 between the conductive pad 774 and another conductive pad 778, which may be further coupled to the antenna 202 (not shown in FIG. 7). Again, the inductance of the notch filter inductor is L1+L2.

The controller 218 programs the variable capacitor 432 via PGM in similar manner and enables or disables the tunable notch filter 716 in similar manner via EN. In this case, however, the tunable notch filter 716 is enabled or disabled by selectively coupling the tunable notch filter 716 to GND rather than selectively coupling the tunable notch filter 716 to the transceiver node 205. Nonetheless, operation of the tunable notch filter 716 is substantially similar. Although the inductor 772 is shown mounted on the PCB 770, it may also be mounted on the semiconductor package 760 in a similar manner as shown by the inductor 662 in FIG. 6.

The arrangement of the components or elements of the tunable notch filters 416, 516 and 616, in which the switch 430 selectively couples an LC series circuit connected to GND to the transceiver node 205, operates in similar manner as the arrangement shown by the tunable notch filter 716, in which the switch 430 selectively couples an LC series circuit connected to the transceiver node 205 to GND. The element ordering in any of these TNF configurations may be rearranged to allow the most optimal implementation. For example, the configuration of the tunable notch filters 416, 516 and 616 may be rearranged similar to that of the tunable notch filter 716, or the tunable notch filter 716 may be rearranged similar to that of the tunable notch filters 416, 516 and 616, in order to achieve the most optimal implementation for a given application.

A selection from among the various configurations of the TNF 216 implemented as a notch filter as shown in FIGS. 4-7 may depend on the target notch frequency and the packaging technology of the semiconductor die. If appropriate, the notch inductor may be implemented solely with a bondwire (e.g., tunable notch filter 416) or at least partly implemented with a bondwire (e.g., tunable notch filters 516 and 616). The notch inductor may be implemented solely as a physical inductor (e.g., tunable notch filter 716) or in combination with a bondwire (e.g., tunable notch filters 516 and 616). The physical inductor may be integrated on the die (e.g., tunable notch filter 616) or on a separate PCB (e.g., tunable notch filters 516, 616 or 716).

The amount of attenuation increases with higher Q implementations and can be maintained over process variations by using calibration of the tuning capacitors. If higher selectivity is needed for an application, a very high quality inductor may be used to implement the trap to realize frequency selectivity within 60-70 MHz, which is less than 3% of the center frequency. On-chip inductors may not be feasible to realize a Q level of 30 at 2.5 GHz. Bondwire inductors are an option to achieve a Q level greater than 20, yet bondwires tend to be restricted to low inductance values. In order to reduce the minimum attenuation and increase selectivity, off-chip high quality inductors for an LC trap with Q>50 may be configured. The LC trap may be automatically tuned as the location of the notch needs to be very accurate.

FIG. 8 is a simplified schematic diagram of a digitally programmable capacitor 800 that may be used as the variable capacitor 432 for any of the tunable notch filters described herein according to one embodiment of the present disclosure, in which PGM is a digital value PGM<0:N>. Each bit of PGM includes an inverted counterpart PGM<0:N>B in which "B" is appended to denote inverted bits. The programmable capacitor 800 includes a pair of capacitor terminals 802 and 804 representing the terminals of the programmable capacitor 800. For example, the capacitor terminal 802 may be coupled to one terminal of the switch 430 and the capacitor terminal 804 may be coupled to the conductive pad 436.

The programmable capacitor 800 includes a series of N+1 capacitors C0, C1, . . . , CN and a corresponding series of N+1 N-channel transistor switches N0-NN, in which each capacitor is coupled in series with the current terminals of a corresponding one of the transistor switches between the capacitor terminals 802 and 804. Thus, C0 is coupled in series with N0 between the terminals 802 and 804, C1 is coupled in series with N1 between the terminals 802 and 804, and so on, up to CN, which is coupled in series with NN between the terminals 802 and 804, each forming one of multiple switch-capacitor pairs coupled in parallel between the capacitor terminals 802 and 804. One terminal of each of the capacitors C0-CN is coupled to the capacitor terminal 802. In each case, the drain terminal of each of the transistor switches N0-NN is coupled to the other terminal of a corresponding one of the capacitors C0-CN, and the source terminal is coupled to the capacitor terminal 804. Each of the transistor switches N0-NN has a gate terminal receiving a corresponding one of N+1 program bits PGM<0>, PGM<1>, PGM<N> from the controller 218.

A series of N+1 resistors R are further provided, each having one terminal coupled to the junction between the resistor-transistor switch pairs between the capacitor terminals 802 and 804. The other terminal of each resistor R is coupled to one current terminal of a corresponding one of a series of N+1 pass gates (a.k.a., transmission gates) G0, G1, . . . , GN. It is noted that the resistance value of the resistors R is chosen to be substantially higher than the ON resistance of the N-channel transistor switches N0-NN. The other current terminal of each of the pass gates G0-GN is coupled to a bias voltage VB. Each pass gate G0-GN is shown implemented as a parallel combination of a P-channel transistor and an N-channel transistor, in which the source terminal of one of the transistors of each pass gate is coupled to the drain terminal of the other, and vice-versa. Each pass gate includes a P-gate control terminal (gate terminal of internal P-channel transistor) and an N-gate control terminal (gate terminal of internal N-channel transistor). The P-gate control terminal of each pass gate G0-GN receives a corresponding one of the program bits PGM<0>-PGM<N>. The corresponding N-gate control terminal of each pass gate G0-GN receives a corresponding one of inverted program bits PGM<0>B-PGM<N>B.

In operation of the programmable capacitor 800, each program bit PGM<0>-PGM<N> is asserted high to turn on the corresponding transistor switch N0-NN to connect the corresponding capacitor C0-CN between the capacitor terminals 802 and 804, and to turn off the corresponding pass gate G0-GN. Each of the control bits PGM<0>-PGM<N> is negated low to turn off the corresponding one of the transistor switch N0-NN to remove or decouple the corresponding capacitor C0-CN from the capacitor terminal 804 and to turn on the corresponding pass gate G0-GN to instead couple the capacitor to VB. For example, when PGM<0> is asserted high, N0 is turned on so that C0 is coupled between the capacitor terminals 802 and 804, while the corresponding pass switch G0 is turned off to isolate C0 from VB. When PGM<0> is negated low, N0 is turned off so that C0 is isolated from the capacitor terminal 804, while the corresponding pass switch G0 is turned on to connect C0 to VB. Thus, the control bits PGM<0>-PGM<N> collectively form the digital program value PGM used to couple selected ones of the capacitors C0-CN in parallel in which the capacitances of the selected capacitors add to select the corresponding capacitance for the programmable capacitor 800. The non-selected ones of the capacitors C0-CN are tied off to the bias voltage to remove and isolate them from the circuit.

The capacitances of the capacitors C0-CN are selected based on the applicable frequency range of use for the particular wireless transceiver and the inductance of the corresponding bondwire or inductor or both. In one embodiment, the capacitances of the capacitors C0-CN are substantially equal to each other. In another embodiment, the capacitances of the capacitors C0-CN are binarily distributed to potentially provide a wider range of frequencies. The number of capacitors N may be selected to achieve the desired resolution or level of accuracy to more accurately tune and attenuate blocker frequencies.

The controller 218 enables the programmable capacitor 800 by asserting the program bits PGM<0>-PGM<N> of the digital program value PGM to a desired value. The controller 218 may disable the programmable capacitor 800, or effectively remove it from the circuit, by asserting each of the program bits PGM<0>-PGM<N> to a zero value. It is appreciated that the additional switch 430 may be used in each case to disable the corresponding tunable notch filter 416, 516, 616, or 716. The switch 430 may be eliminated when using the programmable capacitor 800 in which PGM is asserted to a digital zero value to disable the programmable capacitor 800 and thus the corresponding tunable notch filter.

Figure 9:
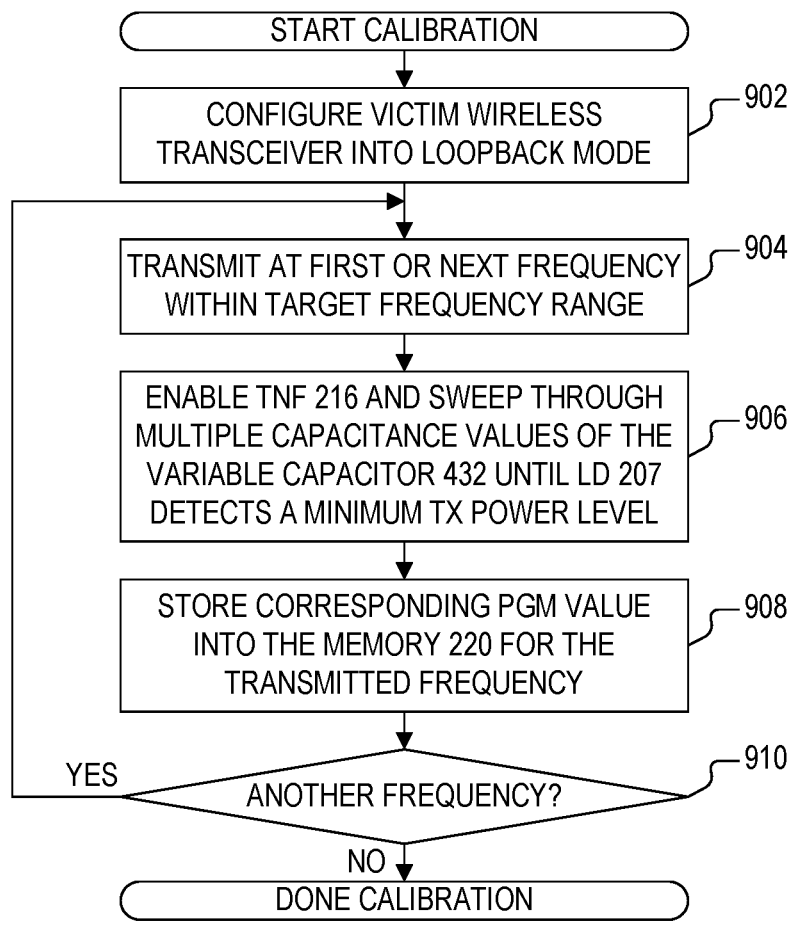
FIG. 9 is a flowchart diagram illustrating a calibration process that may be performed by a victim wireless transceiver according to one embodiment of the present disclosure.

FIG. 9 is a flowchart diagram illustrating a calibration process that may be performed by a victim wireless transceiver according to one embodiment of the present disclosure. The calibration process may be performed by any victim wireless transceiver including those described herein, such as the wireless transceivers 106 or 112 of FIG. 1, the victim wireless transceiver 200 of FIG. 2, or any of the wireless transceivers 400, 500, 600, or 700 of FIG., 4, 5, 6, or 7, respectively, that may be a victim to transmissions of aggressor wireless transceivers. The calibration process is typically performed during manufacturing before being operated in the field.

At first block 902 the victim wireless transceiver is configured into a loopback mode. This means that the TX chain circuit 212 is active for transmitting via the PA 214 while the RX chain circuit 208 including the LD 207 is also enabled to detect the level (e.g., peak level) of the signal being transmitted by the PA 214. At next block 904 the PA 214 transmits at a first or next frequency within a target frequency range. The target frequency range includes the frequencies of operation of the victim wireless transceiver, and may include nearby frequencies that are sufficiently close to the operating frequency to cause blocking interference. The TX chain circuit 212 is configured to adjust and generate any number of frequencies within the applicable frequency range. For example, for 2.4 GHz Wi-Fi, the applicable frequencies may include Wi-Fi center MHz frequencies of 2412, 2417, 2422, etc. for each of the up to 11-14 Wi-Fi channels. The applicable frequencies may include other frequency ranges depending upon the wireless technology employed, such as, for example, any sub-GHz frequencies including, for example, those in the 800-900 MHz range.

At next block 906, the TNF 216 is enabled and the controller 218 sweeps through multiple capacitance values of the variable capacitor 432 until the LD 207 detects a minimum transmit power level. The TNF 216 may be configured in any suitable manner, such as according to any of the tunable notch filters 416, 516, 616, 716 described herein. Also the variable capacitor 432 may be configured in an suitable manner, such as according to the programmable capacitor 800. For the programmable capacitor 800, for example, the controller 218 adjusts the digital program value PGM<0:N> to step through multiple capacitance values for adjusting the notch frequency of the notch filter accordingly. It is noted that not all capacitance values may be selected; instead, since the frequency is known, only those capacitance values at or near the transmitted frequency may be selected. The LD 207 detects the amplitude or strength of the signal being transmitted by the PA 214 as possibly attenuated by the TNF 216. When the capacitance is adjusted so that the TNF 216 is programmed at about the same attenuation frequency as the frequency being transmitted by the PA 214, the LD 207 reaches a minimum value.

At next block 908, the PGM value corresponding with the minimum level detected by the LD 207 is stored into the memory 220 for the corresponding value of the frequency being transmitted. In this manner, when an aggressor wireless transceiver transmits at this same frequency otherwise blocking the victim wireless transceiver, the controller 218 may retrieve this stored PGM value, program the TNF 216 accordingly, and enable the TNF 216 to attenuate the blocking frequency. With reference back to FIG. 3, it is noted that if the blocker is not sufficiently attenuated at block 328, another PGM value may be retrieved or the controller 218 may tweak PGM at block 340 until the blocker signal is attenuated by a maximum amount.

At next block 910, it is queried whether to calibrate for another frequency and if so, operation loops back to block 904 in which the next frequency is selected for transmission. Operation is repeated in subsequent loops until all of the desired frequency values have been calibrated, and then operation is completed.

Figure 10:
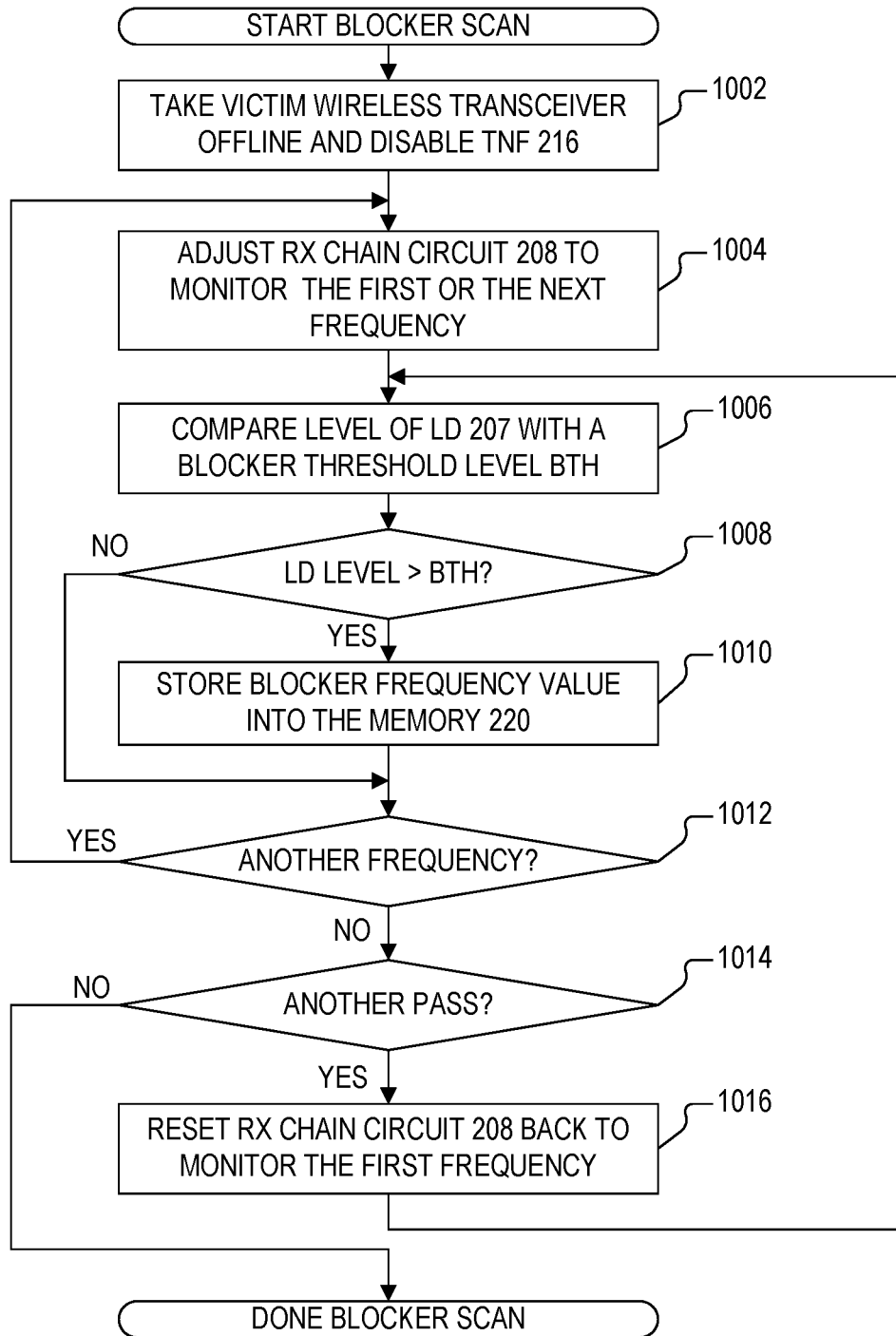
FIG. 10 is a flowchart diagram illustrating a Mocker scan process that may be performed by a victim wireless transceiver according to one embodiment of the present disclosure.

FIG. 10 is a flowchart diagram illustrating a Mocker scan process that may be performed by a victim wireless transceiver according to one embodiment of the present disclosure. The blocker scan process may be performed by any victim wireless transceiver including those described herein, such as the wireless transceivers 106 or 112 of FIG. 1, the victim wireless transceiver 200 of FIG. 2, or any of the wireless transceivers 400, 500, 600, or 700 of FIG. 4, 5, 6, or 7, respectively, that may be a victim to transmissions of aggressor wireless transceivers. The blocker scan process is a form of energy scan that may be performed when the wireless transceiver is operating in the field and in a specific environment in which blocker signals may be present.

At first dock 1002, the victim wireless transceiver is temporarily taken offline and the TNF 216 is disabled. At next block 1004, the RX chain circuit 208 is adjusted to monitor the first (or the next) frequency of operation. Although not specifically shown, the RX chain circuit 208 includes a programmable local oscillator or the like that may be adjusted to a selected frequency. The RX chain circuit 208 then monitors the transmitted energy in the transmission medium at the selected frequency. The selected frequency includes any one of one or more frequencies within the frequency range operation of the victim wireless transceiver. The AGC 209 may be operated to detect signals being transmitted.

At next block 1006, the level of the LID 207 is compared with a blocker threshold level BTH. BTH is a threshold signal strength level of possible blocker signals that may negatively impact receive operation of the victim wireless transceiver. At next block 1008, the level of the LD 207 is compared with BTH. If the LD level exceeds BTH meaning that a strong blocker signal may be present at that frequency, then operation advances to block 1010 in which the blocker frequency value is stored into the memory 220. Operation then advances to block 1012 to query whether another frequency should be evaluated, and if so, operation loops back to block 1004 to evaluate the next frequency. Referring back to block 1008, if the LD level does not exceed BTH meaning that a strong blocker signal may not be present at that frequency, then operation advances directly to block 1012. Operation loops in this manner for each frequency of interest, and corresponding blocker frequencies are stored into the memory 220.

if no other frequencies are to be tested as determined at block 1012, operation advances instead to block 1014 to determine whether another pass of the frequencies may be warranted. The blocker scan may need to be performed for multiple passes to more likely capture blocker signals intermittently being transmitted. If another pass is desired, then operation advances to block 1016 in which the RX chain circuit 208 is reset back to monitor the first frequency, and operation loops back to block 1006 previously described. Operation repeats for as many scan passes as may be deemed necessary to potentially detect blocker signals in the wireless area. When a sufficient number of passes are done, blocker scan operation is completed.

Although not specifically shown, after the blocker scan operation is completed, the victim wireless transceiver may perform a self calibration process similar to the calibration process of FIG. 9. For each of the blocker signal frequencies stored within the memory 220, the victim wireless transceiver may program the RX chain circuit 208 to that frequency, enable the TNF 216, and sweep through applicable capacitance values (e.g., by stepping through multiple values of PGM) while monitoring the LD 207 to determine the value of PGM that attenuates that blocker signal. The corresponding PGM value may then be stored into the memory 220 corresponding to that blocker signal frequency.

The blocker scan process may be performed on a periodic basis, but does take the device offline for a period of time. A coordinator of multiple devices, such as, for example, the victim wireless transceiver 106 managing multiple devices, such as including the victim wireless transceiver 112, may periodically instruct each of multiple devices of a given configuration to perform the block scan process as an energy scan for the local wireless area. Each device, including the coordinator, may be taken offline, one at a time, to scan the energy within its locale and generate a report that includes blocker signals at corresponding frequencies. Each device may then report back to the coordinator, that generates a corresponding energy map of the local wireless network. This information may be used by the coordinator to instruct each subservient device to program its local TNF 216 for applicable blocker frequencies.

It is noted that the TNF 216 may be used for alternative purposes other than attenuating an unwanted or blocker signal. A very strong wanted signal may be received in which the gain blocks of the RX chain 208 are unable to reduce the power level of the wanted signal to the desired range of the ADC within the RX chain circuit 208. As an example, a very high power transmitter transmitting a wanted signal may be brought too close to the victim wireless receiver. In such a scenario, the TNF 216 may be tuned to the transmission frequency of the wanted signal and used to attenuate the desired signal by an amount that enables the RX chain 208 to successfully receive the desired signal.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A wireless transceiver, comprising:
a receiver circuit coupled to a radio frequency transceiver node which is further coupled to an antenna;
a tunable notch filter coupled between the radio frequency transceiver node and a reference node, wherein the tunable notch filter comprises a variable capacitor and an inductance coupled in series between the radio frequency transceiver node and ground, and wherein the inductance comprises a bondwire; and
a controller that is configured to enable the tunable notch filter upon receiving an indication of pending transmission of a collocated transmitter to enable detecting a blocker signal being received via the antenna and to program the tunable notch filter with a selected blocker frequency in an attempt to attenuate the blocker signal to enable the receiver circuit to successfully acquire a desired signal received via the antenna.

2. The wireless transceiver of claim 1, further comprising a switch coupled between the radio frequency transceiver node and the variable capacitor, wherein the controller controls the switch to selectively enable the tunable notch filter.

3. The wireless transceiver of claim 1, further comprising a switch coupled between the variable capacitor and a ground connection, wherein the controller controls the switch to selectively enable the tunable notch filter.

4. The wireless transceiver of claim 1, wherein the controller programs the tunable notch filter by programming the variable capacitor.

5. The wireless transceiver of claim 1, further comprising a memory, wherein the controller programs the tunable notch filter by programming the variable capacitor with a programmed value stored in the memory.

6. The wireless transceiver of claim 1, wherein the inductance comprises a physical inductor coupled in series with the bondwire.

7. The wireless transceiver of claim 1, wherein the controller is further configured to detect that the blocker signal has not been attenuated and to reprogram the tunable notch filter with another blocker frequency.

8. A wireless communication system, comprising:
a communication package incorporating:
a first wireless transceiver;
a second wireless transceiver that operates at a lower power level than the first wireless transceiver; and
a host system interfaced with the first wireless transceiver and the second wireless transceiver; and
wherein the second wireless transceiver comprises:
a receiver circuit coupled to a radio frequency transceiver node which is further coupled to an antenna;
a tunable notch filter coupled between the radio frequency transceiver node and a reference node, wherein the tunable notch filter comprises a variable capacitor and an inductance coupled in series between the radio frequency transceiver node and ground, and wherein the inductance comprises a bondwire; and
a controller that is configured to enable the tunable notch filter upon receiving an indication of pending transmission of the first wireless transceiver to enable detecting a blocker signal being received via the antenna and to program the tunable notch filter with a selected blocker frequency in an attempt to attenuate the blocker signal to enable the receiver circuit to successfully acquire a desired signal received via the antenna.

9. The wireless communication system of claim 8, wherein the host system provides the indication to the controller of pending transmission of the first wireless transceiver along with an indication of the frequency of transmission.

10. The wireless communication system of claim 8, wherein the first wireless transceiver provides the indication directly to the controller of pending transmission.

11. The wireless communication system of claim 8, wherein the tunable notch filter is digitally programmable, further comprising a memory programmed with a plurality of digital values corresponding to a plurality of transmission frequencies of the aggressor wireless transceiver.

12. The wireless communication system of claim 8, wherein the inductance comprises a physical inductor coupled in series with the bondwire.

13. The wireless communication system of claim 8, wherein the controller is further configured to detect that the blocker signal has not been attenuated and to reprogram the tunable notch filter with another blocker frequency.

14. A method, comprising:
- configuring a wireless transceiver with a radio frequency transceiver node coupled between an antenna and a receiver circuit;
- coupling a tunable notch filter between the radio frequency transceiver node and a reference node, wherein the tunable notch filter comprises a variable capacitor and an inductance coupled in series between the radio frequency transceiver node and ground, and wherein the inductance comprises a bondwire;
- enabling the tunable notch filter upon receiving an indication of pending transmission of a collocated transmitter to enable detecting a blocker signal being received via the antenna; and
- programming the tunable notch filter with a selected blocker frequency in an attempt to attenuate the blocker signal to enable the receiver circuit to successfully acquire a desired signal received via the antenna.

15. The method of claim 14, further comprising providing a switch coupled between the radio frequency transceiver node and the variable capacitor, and controlling the switch to selectively enable the tunable notch filter.

16. The method of claim 14, further comprising providing a switch coupled between the variable capacitor and a ground connection, and controlling the switch to selectively enable the tunable notch filter.

17. The method of claim 14, wherein the programming comprises programming the tunable notch filter by programming the variable capacitor.

18. The method of claim 14, further comprising providing a memory, and wherein the programming comprises programming the tunable notch filter by programming the variable capacitor with a programmed value stored in the memory.

19. The method of claim 14, wherein the inductance comprises a physical inductor coupled in series with the bondwire.

20. The method of claim 14, further comprising:
- detecting that the blocker signal has not been attenuated; and
- reprogramming the tunable notch filter with another blocker frequency.

* * * * *